United States Patent
Gimzewski et al.

[11] Patent Number: 6,031,756
[45] Date of Patent: Feb. 29, 2000

[54] MOLECULE, LAYERED MEDIUM AND METHOD FOR CREATING A PATTERN

[75] Inventors: James K. Gimzewski, Rueschlikon; Thomas Jung, Thalwil; Räto R. Schlittler, Schoenenberg, all of Switzerland

[73] Assignee: International Business Machines Corporation, Armonk, N.Y.

[21] Appl. No.: 09/155,915

[22] PCT Filed: Feb. 6, 1997

[86] PCT No.: PCT/IB97/00083

§ 371 Date: Oct. 5, 1998

§ 102(e) Date: Oct. 5, 1998

[87] PCT Pub. No.: WO98/35271

PCT Pub. Date: Aug. 13, 1998

[51] Int. Cl.⁷ ..................... G11C 11/00
[52] U.S. Cl. ........................... 365/151
[58] Field of Search ................ 365/151, 153

[56] References Cited

U.S. PATENT DOCUMENTS 5,623,476  4/1997  Eguchi et al. ............. 365/151
5,751,629  5/1998  Nova et al. ............... 365/151

*Primary Examiner*—David Nelms
*Assistant Examiner*—VanThu Nguyen

[57] ABSTRACT

The invention relates to molecules which can be attached to a substrate (4) and switched between different stable or metastable conformations (18, 19). At least one of these conformations (19) is generated and/or stabilized by the proximity of the substrate (4). The invention further relates to a layered medium comprising such molecules and to a method to switch such molecules in a controlled way. The layered medium is usable as resists for lithographic application, data storage media, and promoter of electron transfer between two media. The method is usable to generate and interrogate patterns in the layered medium.

18 Claims, 8 Drawing Sheets

MOLECULE, LAYERED MEDIUM AND METHOD FOR CREATING A PATTERN

TECHNICAL FIELD

The present invention relates to a molecule that is able to adhere to surfaces of substrates in different conformations, a method of patterning layers of such molecules by switching them from one conformation into another, and to the usage of such patterned layers for lithography, data storage, and display technology.

BACKGROUND OF THE INVENTION

The dramatic progress of computer technology over the past four decades has been fueled by an unparalleled development of the three basic hardware elements: storage devices, processors and displays. In all three areas, the art and science of surface structuring is of essential importance. The trends towards miniaturization and integration as well as towards improved performance. reliability, and productivity require increasingly better control of surfaces and interfaces down to the molecular or atomic level.

Today. design rules for integrated circuits and storage devices have become so small that some of the most important conventional structuring techniques got close to their principal limits. Standard optical lithography, for instance, is bound to dimensions larger than about one half wavelength which amounts to about 140 nm for uv radiation. The bitsize of CD-ROMs is limited to about 0.5 micron because present-day light-emitting diodes radiate red light with wavelengths of 800 to 1000 nm. Obviously, new techniques are needed in order to further reduce the design rules.

With regard to display technology, the trend towards flat panel designs generates an increasing need for large, matrix addressable arrays of pixel elements. Here, the technical problem is not miniaturization but energy efficiency. yield and cost. At present, liquid crystal displays (LCD) play the major role in flat-panel technology. The LCD cell changes its optical transmissivity by appropriate application of voltage. Excellent contrast is achieved if arrays of thin film transistors (TFT) turn on and off the individual LCD cells. This scheme however. is costly and TFT-LCDs are correspondingly expensive. Moreover, LCDs quite generally suffer from poor energy efficiency since they have to be illuminated by an external light source, the different colors resulting from filtering of white light. Because of these short-comings, the display industry is greatly interested in potential alternatives to the LCD technology.

Light-emitting diodes (LED) are much more energy efficient than LCDs but the presently available LEDs are too expensive for large-scale display panels. Present R&D activities in this field therefore concentrate in particular on organic LEDs (OLED) which hold promise for low-cost mass production. An overview about the design and properties of OLEDs can be found in the article by J. R. Sheats, H. Antoniadis, M. Hueschen, W. Leonard, J. Miller, R. Moon, D. Roitman, and A. Stocking "Organic Electroluminescent Devices" which appeared in Science Vol. 273, p. 884, 1996. In principle, OLEDs consist of layers of polymers sandwiched between a metallic and a transparent semiconducting electrode. The main short-coming of OLEDs is presently a short lifetime because of chemical interactions with the environment and degradation due to electron injection at too high energies, necessitated by a poor match of the electronic properties of the polymers with respect to the electrode materials.

It is possible, however, to influence the electron injection capability by modification of the molecules next to the electrode/polymer interface. A. Haran, D. H. Waldeck, R. Naaman, E. Moons and D. Cahen describe in "The Dependence of Electron Transfer Efficiency on the Conformational Order in Organic Monolayers", Science Vol. 263, pp. 948–950, 1994, for instance, the influence of a monolayer of octadecyltrichlorosilane (OTS) molecules on the electron transfer (ET) process from a silicon electrode into an aqueous electrolyte solution.

The OTS layer can be switched by heating from one conformation into another. The different conformations correspond to different geometries of a given molecule arising from bending or flexing of certain molecular bonds.

The authors found that current-voltage characteristics depend not only on the degree of coverage but also on the conformation of the OTS molecules. In one example, the reverse current at a voltage of 0.2 V changed from 4.5 to 0.2 microamperes when the layer was transformed from the one into another conformation.

Research towards the controlled fabrication of small structures has been greatly inspired by the success of scanning probe microscopes (SPM) in recent years. Numerous examples confirm that the pointed probe tip of the SPM not only is able to monitor variations in the sample surface structure with atomic or near-atomic resolution but that it also can be used to modify the surface on a similar scale. It was demonstrated by T. A. Jung, R. R. Schlittler, J. K. Gimzewski, H. Tang, and C. Joachim in Science, Vol. 271, p. 181, 1996, for instance, that individual molecules can be moved into prescribed fixed new positions and/or be modified without change of position under the influence of the SPM tip. In the pursuit of such investigations it was found that molecular flexibility plays a crucial role for such manipulations.

Fixed ordered molecular layers on a substrate are generated, e. g. by molecules forming Langmuir-Blodgett (LB) or self-assembled monolayer (SAMI) films or undergoing cooperative self assembly or being deposited by sublimation or by conformational epitaxy.

The molecules can exist in different conformations which are characterized by the (meta-) stable orientations and/or positions of the different entities of which they are made up. The different entities of these molecules consist of individual atoms or molecule-like sub-entities of atoms which are more strongly bound among each other than to the atoms of the other entities. Frequently, the connections between individual entities arc single molecular bonds which can act as axis for a relative rotational motion of the entities. Switching between different conformations usually comprises such rotational realignment of entities. Molecules structured into such entities are standard in organic chemistry.

OBJECT AND ADVANTAGES OF THE INVENTION

The invention combines fixation of switchable molecules to a substrate with the existence of several stable or meta-stable conformations to allow to determine and switch their conformation individually or within a certain region by external influence.

Appropriate combination of different entities allows to design molecules which match the requirements of a certain application in one conformation but are greatly different in another. Among the technically important properties which may undergo such variations are chemical activity, electrical conductivity, color, molecular dimensions, and the strength of adhesion to the substrate. Conversely, these changes can be used to identify the conformation of a certain molecule or a layered medium of such molecules by a variety of interrogating techniques. The different conformations of such molecules are defined as the minima of the potential energy of the system molecule/substrate with respect to its configurational coordinates. It is usually possible to define a relevant configurational coordinate for each transition between two conformations, such that the potential energy, when plotted as a function of this coordinate, has at least two characteristic minima. The position and depth of these minima determine the structural arrangement of the entities in these conformations and their stability with respect to thermal excitation and/or external influences, respectively. The deepest minimum corresponds to the stable conformation of the molecule. All the other conformations are metastable. A molecule can exist in a metastable conformation for indefinite time if the energy barriers between the corresponding energy minimum and its neighbors is large enough compared to the thermal energy which amounts to 25 meV at room temperature.

External influences which can provoke switching of conformation are, for instance, a mechanical force which deforms the molecule to such an extent that it can snap into a different conformation like a macroscopic switch, irradiation with light or elections that raises it into an excited state state from which it can decay into the groundstate of another conformation, application of an electric field which lowers the height and/or width of a particular energy barrier to such an extent that the molecule flips into another conformation due to thermal excitation or tunneling. In the following, the term "conformation" shall designate only those conformations of a molecule between which switching by external influence is possible.

It is a first object of the invention to provide a class of molecules which are attachable to a substrate in different conformations, at least one of these conformations being generated and/or stabilized by the proximity to the substrate surface. Furthermore, these molecules are switchable between at least two of these conformations by an external influence, exerted by a structuring means.

Cu-tetra-(3, 5 ditertiary-butyl-phenyl) porphynrn (Cu-TBP-porphyrin) molecules, for example, freshly deposited onto a (100)-oriented Cu crystal surface in ultrahigh vacuum, remain in a conformation closely similar to that of the free molecules. In this conformation, the peripheral entities of the molecules are oriented normal to the plane of the central entity and the central entity is far enough away from the substrate surface to be only scarcely influenced by interaction forces. When pressed down by the tip of an STM, however, the central part gets so strongly attracted towards the substrate due to attractive, here adhesive forces, that it remains in this second state even when the tip is removed: The system CuTBP-porphyrin/substrate is bistable, in contrast to the free molecule.

A molecule according to independent claim 1 for which Cu-TBP-porphyrin is an example consists of different entities and is attachable to a substrate by means of physical adhesion and/or formation of chemical bonds. This has the advantage that the position of these molecules is fixed at least in one dimension although the molecules may be free to move along the surface of the substrate. It has the further advantage that the substrate can balance a force exerted on the molecule during switching or that it can act as electrode if the molecule is to be exposed to an electric field. It is a further characteristic of the molecules according to claim 1 that one of the conformations is stable only in the presence of the substrate. Specifically, one of the entities changes position with respect to the substrate during switching in such way that the attraction between substrate and that entity is negligibly small in the first conformation but strong in the second conformation such that that entity closely and stably adheres to the substrate surface after switching. This has the advantage that molecules which exist in one conformation only in free space can become bistable when attached to a substrate and therefore can be used for the different applications described later. The drastic change of interaction with the substrate has the further advantage that the molecule can be completely immobile in the substrate-dominated conformation but movable along the substrate surface in the other conformation, or vice versa.

A molecule according to claim 2 has the advantage that it is fixed at a certain position on a substrate in at least one of its conformations and therefore can be addressed individually by an interrogating or structuring means. In particular, the structuring means can select a molecule and switch it from one conformation into another. The fixation of the molecule has the further advantage that the conformation of a particular molecule or of a multitude of such molecules can be determined by an interrogating means locally and individually.

A molecule according to claim 3 has the advantage that it is switchable back and forth between two conformations repeatably which allows for applications in display units or in write/read storage devices.

A molecule according to claim 4 has the advantage that it is built according to a clear and hence well-realizable design concept: A central entity can be designed to dominate the observable physical and chemical properties while one or several peripheral entities may then define the overall structure of the molecule, potentially protect the central entity, and/or form the 'legs' which connect the molecule to the substrate. As a further advantageous feature of a molecule according to claim 4, the distance of the central entity from the substrate can be changed in the switching process, for instance by tilting the peripheral entities from an upright to a sideways position. As a consequence, the molecule may be moveable along the substrate surface in a first conformation but completely fixed in a second. It further may be more easily removed by a solvent in the first conformation and have a larger height than in the second. Also the characteristics of the electronic states of a molecule can differ strongly in the two conformations. Optical properties such as the fluorescence of a molecule hence can vary drastically in the two conformations.

Many anticipated applications of the switchable, attachable molecules according to claims 1 to 4 require the coverage, control and/or modification over areas (much) larger than the size of individual molecules. It therefore is a second objective of the invention to provide a layered medium which comprises molecules according to claims 1 to 4.

A layered medium according to claim 5 in the form of a complete monolayer has the advantage that it forms a dense film which effectively protects the underlying substrate. Incomplete monolayers according to claim 5, on the other hand, have the advantage to expose part of the substrate, hence provide access to this part by a modifying medium even without removal of the layered medium.

A layered medium according to claim 6 has the advantage that the molecules are at a fixed position in any conformation. This is favorable in applications where the molecules are used as information carriers or as reversible switching elements, since they are then reproducably addressable.

A layered medium according to claim 7 has the advantage that the molecules of an incomplete monolayer continuously vary their lateral position due to thermal excitation. Hence, part of the substrate is not permanently covered by molecules, i. e. this part is exposed to the environment for certain periods of time and hence can be attacked by a modifying means during these periods. In the conformation where the molecules form a complete monolayer, on the other hand, the substrate surface is permanently shielded from the influences of the environment.

A layered medium according to claim 8 has the advantage that the molecules can act as local electric switches which regulate the electron transfer from or to the substrate to or from a medium located above the layered medium. The switching is made possible by an arrangement of electronic levels of the molecules in the layered medium which facilitates the emission of electrons from or to the substrate in one conformation but is unfavorable for the emission in another conformation.

The application according to claim 9 is an important application of a layered medium, since by incorporation of the layered medium into an OLED, an electron injection layer is provided whose injection capability can be turned on and off by a structuring means. The latter may provide, for instance, for a short voltage pulse applied to the two electrodes of the OLED. Alternatively, for example, piezoelectrically generated pressure pulses may cause the switching. The function of the switchable electron injection layer is similar to that of the thin-film transistors used in present-day active LCDs.

Many anticipated applications of the layered medium according to claims 5 to 9 require the generation of predetermined patterns in this layered medium and/or the underlying substrate. It therefore is a third objective of the invention to provide a method that allows such patterning in a favorable way.

Claims 10 to 13 disclose different process variations that allow to structure the layered medium and optionally the underlying substrate.

Claims 14 to 17 disclose methods that allow to generate patterns by exerting locally and in a controlled way one or several of the external influences, such as a mechanical force which deforms the molecule to such an extent that it can snap into a different conformation like a macroscopic switch, irradiation with light or electrons that raises it into an excited state state from which it can decay into the ground-state of another conformation or an application of an electric field which lowers the height and/or width of a particular energy barrier to such an extent that the molecule flips into another conformation due to thermal excitation or tunneling.

A method according to claim 10 has the advantage that it allows to generate a predetermined pattern in a layered medium which consists of areas where the molecules are in one conformation and other areas where they are in another conformation. The layered medium favorably is prepared in such a way that all the molecules originally are all in the same conformation. The areas to be converted into the other conformation then can be selected by an appropriate structuring means in a first step and exposed to its influence in a second step.

A method according to claim 11 has the advantage that the molecules which are in one of the conformations are selectively removed from the substrate leaving behind a predetermined pattern which consists of areas where the substrate is covered by the layered medium and other areas where the substrate surface is uncovered. A first molecule-removing means is used for this purpose which may be a solvent or a wet or dry etchant.

A method according to claim 12 has the advantage that the surface of a substrate which was treated according to claim 10 and optionally claim 11 can be structured in the shape of the pattern by exposing it to a modifying means which attacks the unprotected parts of the substrate surface. The modifying means can either remove material from or deposit material onto the unprotected areas of the substrate surface. This processing step is optional if a layered medium according to claim 7 is employed since the latter allows access of a modifying medium to the substrate.

A method according to claim 13 has the advantage that the substrate is freed from the residues of the layered medium, leaving behind the predetermined pattern on the substrate surface. A second molecule-removing means may be used for this purpose which may be, like the first, a solvent or a wet or dry etchant with the capability, however. to remove all the molecules which are or were part of the layered medium. The complete removal has the advantage that it allows to further process the substrate as required, for instance, in the production of integrated circuit electronic elements.

Pattern generation by means of a movable, guided stylus according to claim 14 has the advantage that extremely small parts of a layered medium on a substrate can be selected and switched. This allows to trace out correspondingly small size structures on the substrate. It is a further advantage of this method that the shape of the pattern can be varied freely by reprogramming of the path of the stylus along the substrate. The external influence of a stylus comprises, for example, mechanical pressure, exposure to an electric field or to a beam of electrons or photons. This method of pattern generation therefore is particularly suited for applications where great flexibility is required, for instance for testing in research and development.

Pattern generation by means of a stamp according to claim 15 has the advantage of great simplicity. In particular, it is possible to generate the whole pattern simultaneously, even if it has a very complicated structure. Furthermore the pattern can be readily reproduced in large quantities. This method of pattern generation therefore is particularly suited for mass production, for instance of compact disc-type read-only storage carriers using a layered medium according to claim 6 as storage medium.

Pattern generation by means of an actuator array according to claim 16 has the advantage that the pattern generator, i. e. the actuator array, can remain at a a fixed position with respect to the substrate. It is a further advantage of this method that the shape of the pattern can be varied freely by appropriate addressing of the array elements to be activated. Parallel operation of a number of elements furthermore allows for high processing speed, in particular since mechanical motions are not required. This method of pattern generation therefore is particularly suited for applications which require frequent and reversible pattern change, for instance when used as switching elements in write/read storage devices or in display devices.

The elements of the array can be, for example, electrodes, piezoelectric pestles or light sources such as illuminated apertures with shutters. Electrodes have the advantage that they expose the molecules of a layered medium locally to an electric field or an electron beam. Piezoelectric pestles have the advantage that they can exert mechanical pressure or send a shock wave into the layered medium. Light sources have the advantage that they can bring the molecules of the layered medium into an excited electronic state from which they may also decay into a new conformation.

Pattern generation by means of an illumination or particle beam apparatus according to claim 17 has the advantage that commercial lithographic tools can be used for pattern generation.

It is also possible to combine several of the methods according to claims 14 to 17 in a favorable way, for instance to use arrays of SPM tips for larger throughput in the patterning process.

Pattern interrogation according to claim 18 has the advantage that the conformation of the molecules in a certain area can be determined with the same means that is used for pattern generation. This has the further advantage that the generated patterns can be controlled for potential errors which possibly can be corrected on the spot. Another major advantage is the capability to determine the shape of an existing pattern which is required in the process of reading if the layered medium is used as a storage medium.

SUMMARY OF THE INVENTION

This invention deals with the application of a specific single molecule, a molecular assemblys, and a single molecular layer at an interface towards a substrate for data storage, as a new type of resist or in the context of various molecular devices. The principle of operation is switching between conformations of the molecule which is created by design of functionality in the molecule together with the interfacing substrate. More particularly, it uses a molecular bi-stability which is brought up through functional design of the molecule under consideration of the relevant properties of the interfacing substrate. Presented embodiments include positive and negative resist applications, ultra-high-density storage.

The invention furthermore presents methods for the adressing and switching of molecular properties, in particular electron transport and photon emissivity.

The activation energies and mechanisms for switching the molecule from one conformation into another may be chosen according to molecular structure, internal flexibility and the integral interaction of the molecule with the substrate. The system molecule/substrate is optimally adjusted when the potential barrier for switching is well above thermal energies kT, wherein T denotes the temperature of reliable operation.

The molecule can be synthesized using existing methods. The immobilization of this molecule at the substrate surface enables the use of micro- and nano-fabrication tools and methods for optional further processing. The application of the molecule in a molecular layer as a new type of resist enables the generation of nanometer-scaled patterns. The disclosed molecule, layered medium, and method enable a broad applicability and a variety of combinations with other established and exploratory methods.

Presented embodiments include resist applications, ultra high density storage, and display applications. The invention presents methods for the addressing a location on a substrate, switching, and interrogation of molecular properties, in particular of the degree of adhesion to the substrate and electron transfer efficiency.

The large variety of molecules that fall into the class of the disclosed molecule as well as the large variety of the disclosed methods enables broad range of applications and of combinations with other established and exploratory techniques.

DESCRIPTION OF THE DRAWINGS

Examples of the invention are depicted in the drawings and described in detail below by way of example. It is shown in FIG. 1a: A molecule with a central entity and peripheral entities in a first stable conformation.

DETAILED DESCRIPTION OF THE INVENTION

In the following various exemplary embodiments of the invention are described.

Figure 1A:
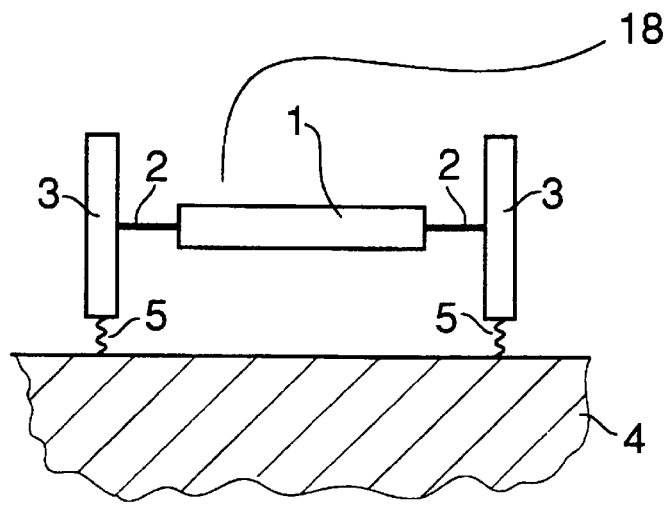
FIG. 1b: A molecule with a central entity and peripheral entities in a second stable conformation.
FIG. 1c: A substrate with three molecules in different stable conformations and with a stylus.

FIG. 1a schematically shows a molecule, consisting of a first entity 1 which here is a central entity and two second entities 3 which here are peripheral entities. The first entity 1 is bound to the second entities 3 via connections 2. The entities 3 adhere to a substrate 4 due to a second attractive force 5. The molecule is in a first conformation 18 where the central entity 1 and the peripheral entities 3 are oriented at right angles to each other. This orientation is energetically favorable with regard to the directionality of the connections 2. The central entity 1 is positioned at a distance from the substrate 4 where a first attractive force 6 which here is a short-range adhesion force exerted by the substrate 4 on the central entity 1 is small and hence not depicted here. The interaction between the molecule and the substrate 4 due to the second attractive force 5 is restricted to the parts of the peripheral entities 3 which are in the immediate proximity of the substrate surface. Therefore, the first conformation 18 is nearly identic to the stable conformation of the molecule in free space or in solution.

Figure 1B:
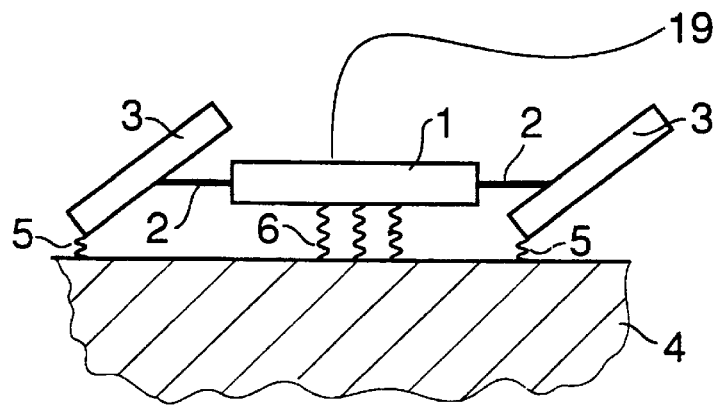

In FIG. 1*b*, the molecule is depicted in a second conformation 19 where the peripheral entities 3 are tilted sideways such that the central entity 1 is closer to the surface of the substrate 4. The central entity 1 now is under the influence of the strong attractive force 6 towards the substrate 4. The position of the central entity 1 is determined by the balance of the additional attractive force 6 and a restoring force generated by tilting of the connections 2. The second conformation 19 does not exist when the molecule is in free space or in solution. The tilt angle may be used as the relevant configurational coordinate of this molecule.

Figure 1C:
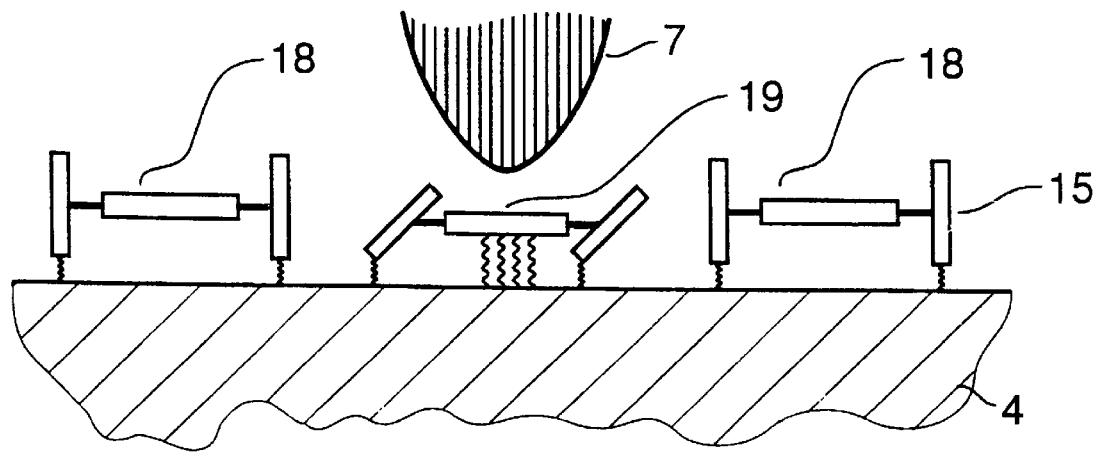

FIG. 1*c* schematically shows the transformation, i. e. the switching of a molecule from the first conformation 18 into the second conformation 19 under the influence of a stylus 7 which here is an SPM tip. The molecule is part of a layered medium comprising a complete monolayer 15 of the molecules on the substrate 4. The SPM tip 7 forces a selected molecule to switch by exerting, for instance, mechanical pressure on the molecule.

Figure 2A:
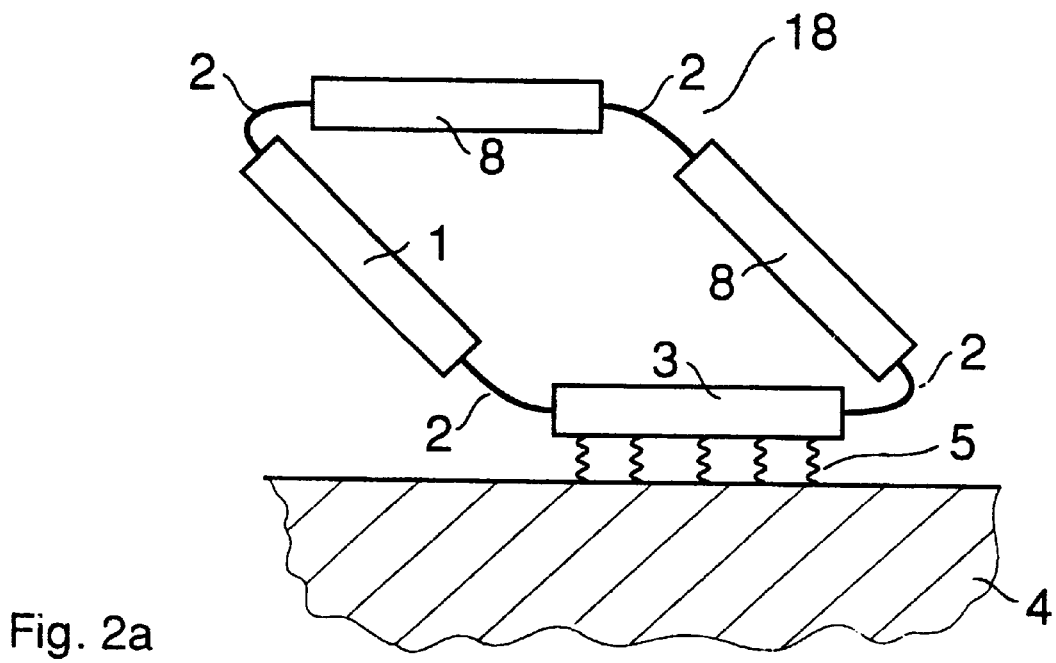
FIG. 2a: A molecule with four equivalent entities in a first stable conformation.

FIG. 2*a, b* show another type of molecule in the two conformations 18, 19. The molecule consists of the first entity 1, the second entity 3 and two third entities 8, bound to each other in a closed chain by four connections 2. The four entities 1, 3, 8 are here compositionally identic. FIG. 2*a* shows this molecule in the first conformation 18 in which the entities 1, 3, 8 are arranged in the shape of a deformed square since the tilted shape of the connections 2 is energetically favorable for the molecule. The second entity 3 adheres to the substrate 4 via the second attractive force 5. The other entities 1, 8 are too far away from the substrate 4 to experience a sizable attraction.

Figure 2B:
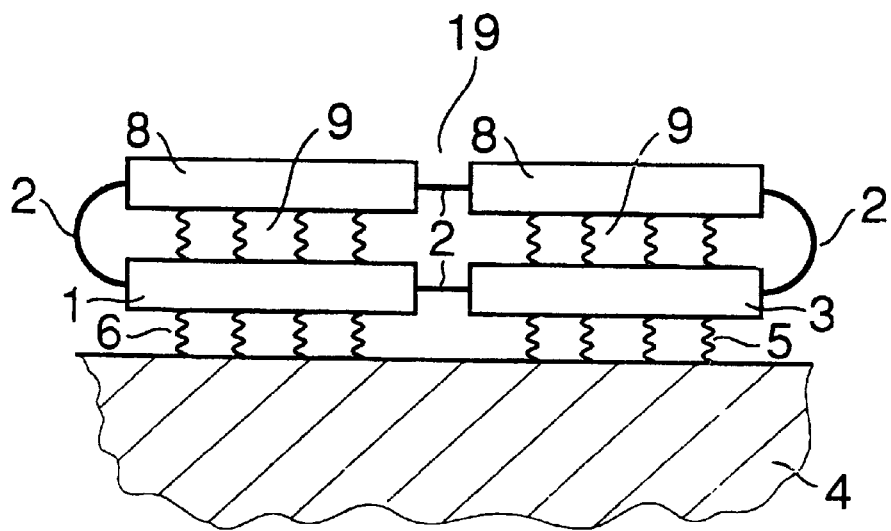
FIG. 2b: A molecule with four equivalent entities in a second stable conformation.

FIG. 2*b* shows the molecule in the second conformation 19 in which the first and second entities 1, 3 are lying flat on the substrate 4 and the third entities 8 are lying on top of of the first and secondentities 1, 3. The first entity 1 and the second entity 3 experience the attractive forces 5 and 6, respectively, exerted by the substrate 4. The third entities 8 are attracted to the entities 1, 3 by a cohesive force 9. The shape of the molecule in this second conformation 19 implies a strong deformation of the connections 2. The resulting elastic forces are balanced by the attractive force 6 and the cohesive force 9. One of the tilt angles of the connections 2 may be chosen as the relevant configurational coordinatefor this type of molecule.

Figure 3:
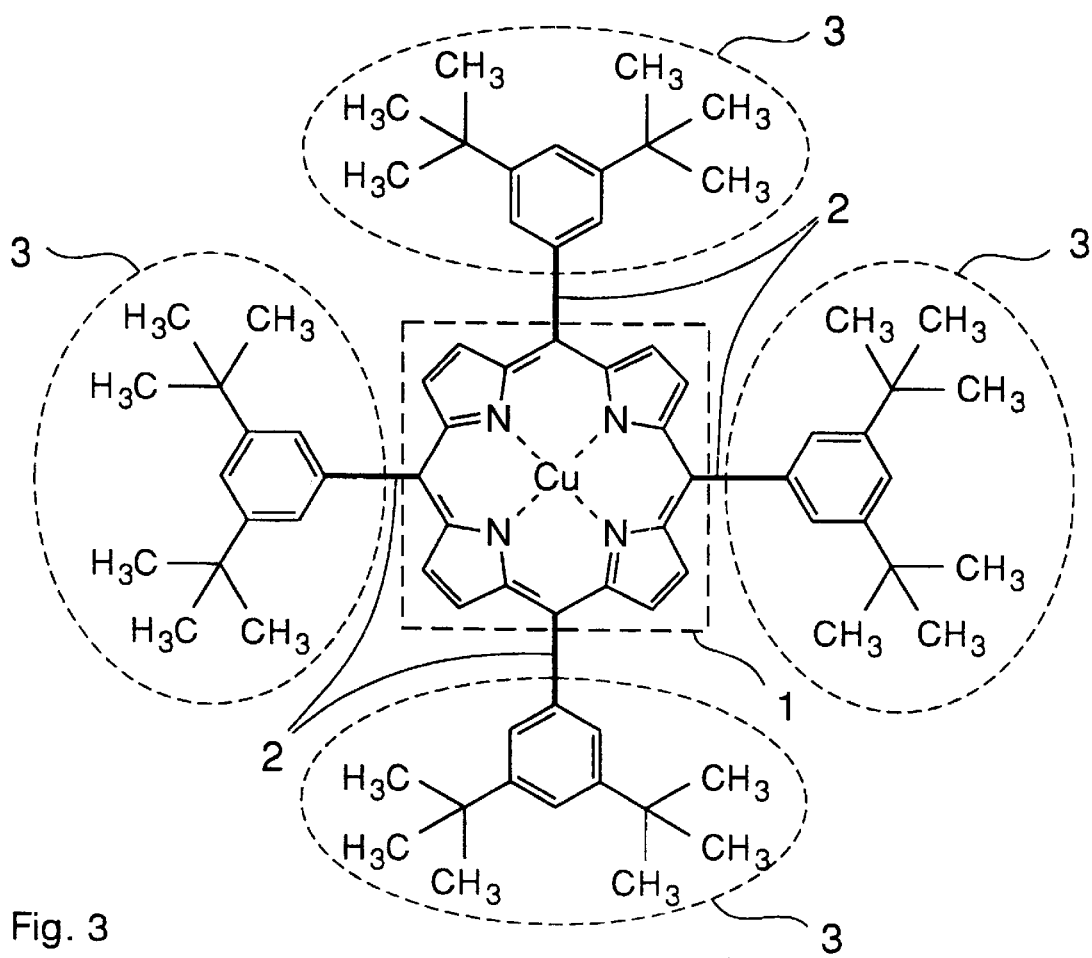
FIG. 3: The structure formula of Cu-tetra-(3,5 ditertiary-butyl-phenyl)porphyrin (Cu-TB-porphyrin).

FIG. 3 depicts the structure formula of Cu-tetra-(3,5 ditertiary-butyl-phenyl) porphyrin (Cu-TBP-porphyrin), a molecule which is able to exist on a substrate 4 in the two conformations 18 and 19 according to FIG. 1. The central entity 1 is the Cu-porphyrin part. The peripheral entities 3 are the four butyl-phenyl groups. The connections 2 consist of the directional molecular bonds between C atoms of the central entity 1 and the peripheral entities 3, respectively. The peripheral entities 3 are able to rotate around these C—C axes, the average tilt angle being the relevant configurational coordinate of this molecule.

In the first conformation 18, as shown in FIG. 1*a*, the peripheral entities 3 are rotated out of the drawing plane by an angle of 90 degrees around the C—C axis. The peripheral entities 3 therefore prevent an approach of the central entity 1 to a substrate 4 beyond a distance given by the special extension of the peripheral entities 3 with respect to their C—C axis. In the second conformation 19, as shown in FIG. 1*b*, the peripheral entities 3 are oriented almost parallel to the drawing plane, thereby allowing close contact between the central entity 1 and the substrate 4.

Figure 4A:
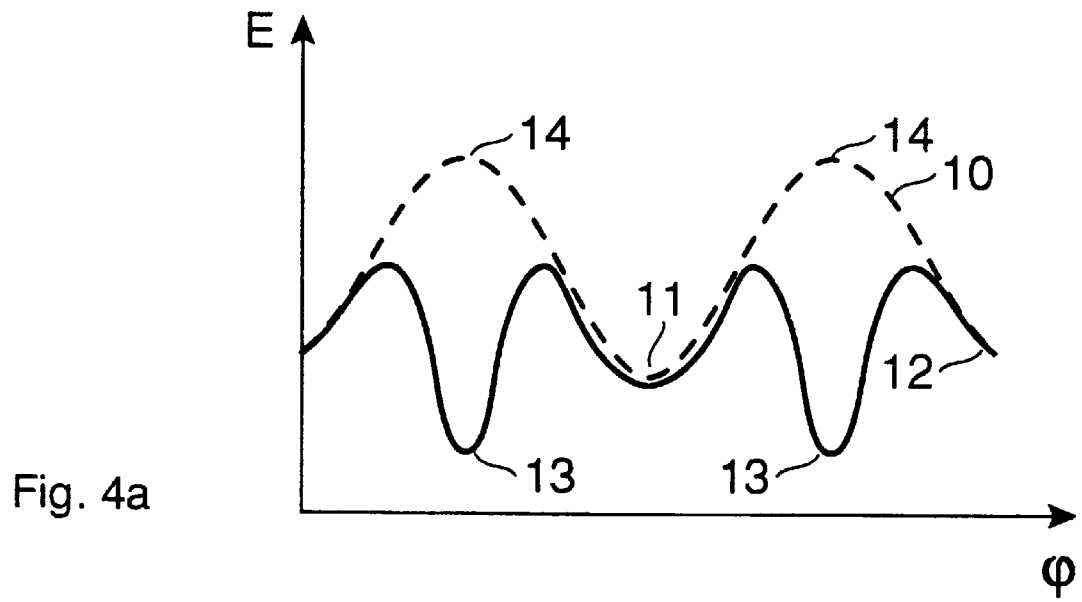
FIG. 4a: The potential energy of a molecule in free space (dashed curve) and near a substrate surface (solid curve) with respect to a particular configurational coordinate, whereby a potential well is generated by the vicinity to the substrate.

FIG. 4*a, b* schematically sketch the energy potentials E of the two molecules shown in FIGS. 1 and 2, respectively, as a function of the respective relevant configurational coordinate φ. The dashed curves 10 and solid curves 12 represent the potential of the molecules in free space and next to the substrate 4, respectively. In FIG. 4*a*, the dashed curve 10 has a potential minimum 11 and two potential maxima 14 whereas the solid curve 12 has three potential minima, one higher potential minimum I1 and two lower potential minima 13.

The single potential minimum 11 of the dashed curve 10 in FIG. 4*a* indicates that there is only one energetically favorable orientation in free space, namely that of the first conformation 18. When attached to the substrate 4, two additional potential minima 13 result from the first attractive force 6 between the substrate 4 and the central entity 1. The minima 13 are achieved at the values of the relevant configurational coordinate φ which are most unfavorable for a free molecule, since they lie at the maxima 14 of the potential energy. The minima 13 correspond to the second conformation 19. The existence of the several potential minima 13, 1 shows the capability to switch the molecule between two or more stable or metastable conformations.

Figure 4B:
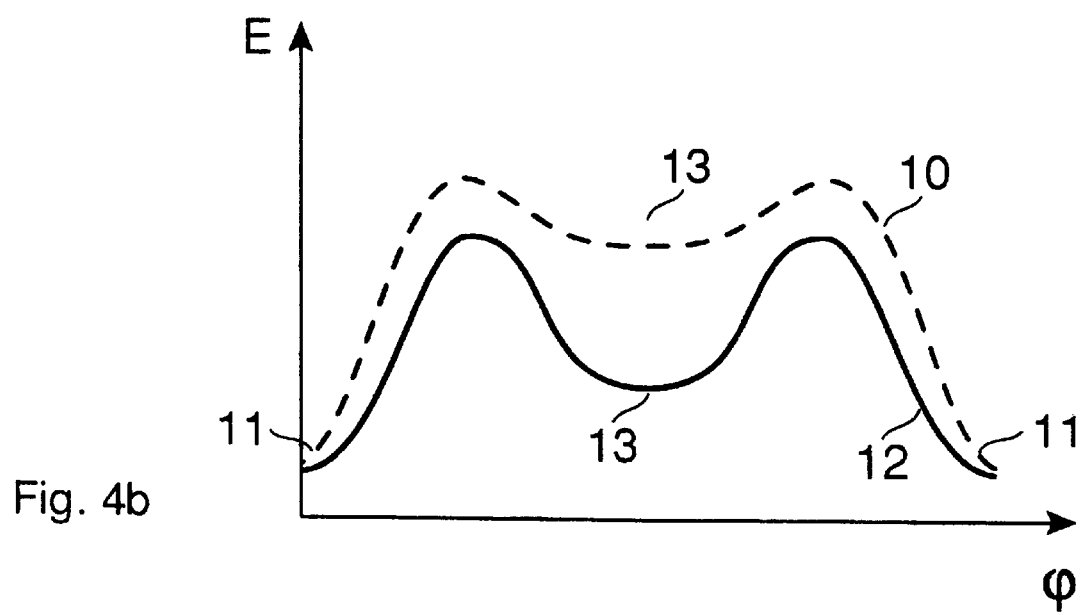
FIG. 4b: The potential energy of a molecule in free space (dashed curve) and near a substrate surface(solid curve) with respect to a particular configurational coordinate, whereby an existing potential well is enhanced by the vicinity to the substrate.

For a molecule of the type shown in FIG. 2, the stable conformation in free space is that shown in FIG. 2*a*. The conformation of FIG. 2*b* is also possible in principle because of the cohesive force 9. The resulting potential curve 10 is depicted as the dashed curve in FIG. 4*b* and therefore has the nonequivalent minima 11, 13 already in free space but the second minimum 13 is shallow. Thermal excitation therefore prevents the molecule to remain in the corresponding conformation for extended periods of time. The substrate 4 stabilizes this second conformation due to the first attractive force 6. This is expressed in the deep minimum 13 of the solid curve 12 in FIG. 4*b*.

Figure 5A:
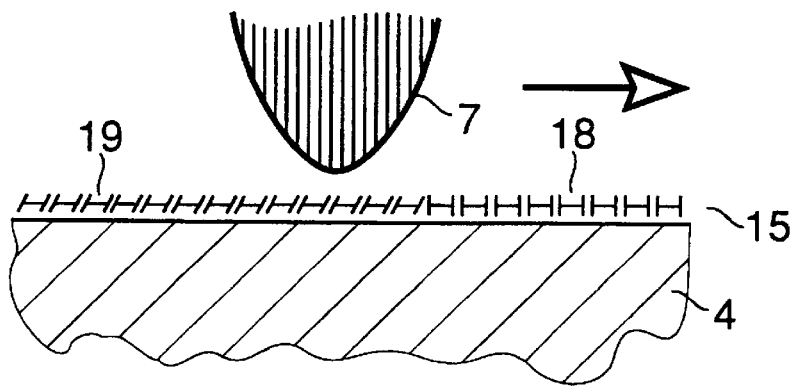
FIG. 5a: An arrangement for switching molecules of a layered medium in selected areas from one conformation into another one with a tip of an SPM.
Figure 5B:
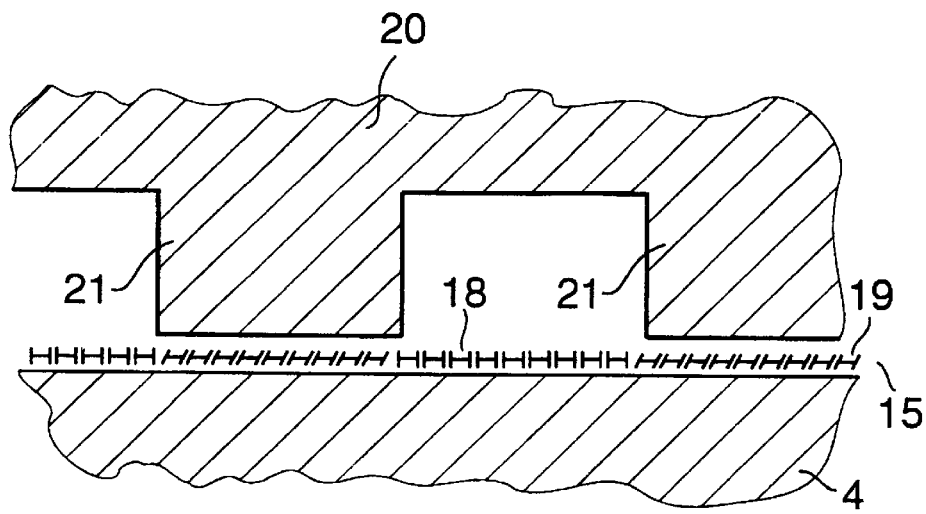
FIG. 5b: An arrangement for switching molecules of a layered medium in selected areas from one conformation into another one with a stamp.
Figure 5C:
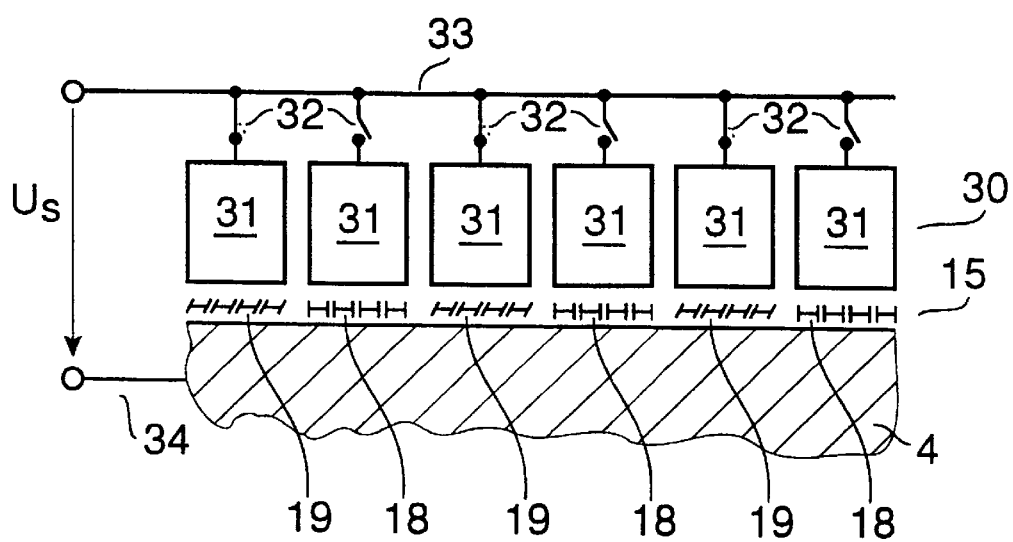
FIG. 5c: arrangement for switching molecules of a layered medium in selected areas from one conformation into another one with an electric actuator array.

FIG. 5*a* to *c* show layered media with switchable molecules which here are arranged as complete monolayers 15 on the substrate 4 and three arrangements which allow to switch the molecules selectively in predetermined areas such that patterns are created. The molecules are switched from the first conformation 18 into the second conformation 19. The two conformations 18, 19 are indicated in the figures by lines of "H" and "/-/" symbols, respectively.

FIG. 5*a* shows pattern generation by use of a stylus 7 which may e. g. be an SPM tip. A horizontal movement of the stylus 7 at close distance to the monolayer 15 switches the touched molecules from the first conformation 18 into the second conformation 19. In order to leave predetermined areas in the first conformation 18, the stylus 7 can be retracted while moving over these selected areas.

FIG. 5*b* shows pattern generation by use of a stamp 20 with protruding parts 21. Predetermined areas of the monolayer 15 are to be switched. The protruding parts 21 exert a mechanical pressure on the areas of the layered medium which forces the molecules of the areas of the monolayer 15 to switch from the first conformation 18 into the second conformation 19.

FIG. 5c shows pattern generation by use of an actuator array 30 with individual actuators 31. Predetermined areas of the monolayer 15 are exposed to an electric field which switches the molecules of the monolayer 15 from the first conformation 18 into the second conformation 19. The areas to be switched are selected by electric switches 32 which connect the individual actuators 31 with a voltage supply line 33. The latter is kept at a voltage $U_s$ with respect to a second voltage supply line 34 which is connected to the substrate 4.

FIG. 6a–e and FIG. 7a–e show the use of a monolayer of attachable, switchable molecules for patterning the surface of a substrate 4 in a lithographic process. For this application, the monolayer 15 has the function of a resist.

FIG. 6a–e sketch the different steps necessary for a layered medium which comprises a complete monolayer 15 consisting of the molecules in both conformations 18, 19 which are firmly attached to the substrate 4, such as the molecules in the "H"-shaped conformation 18 of FIG. 1.

Figure 6A:
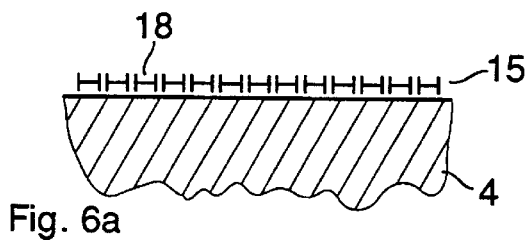
FIG. 6a–e: Subsequent steps in a process of structuring the surface of a substrate with an incomplete monolayer of switchable, attachable molecules.
Figure 6B:
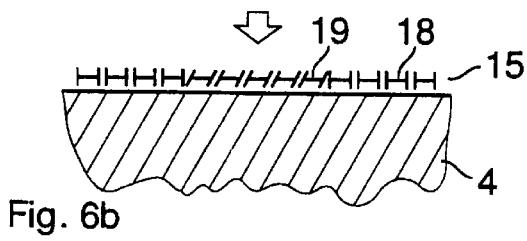
Figure 6C:
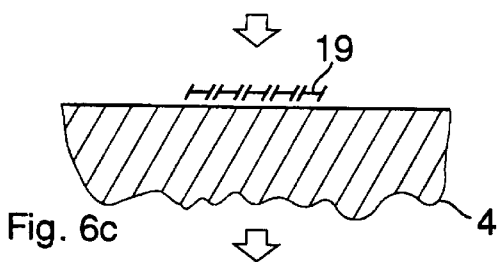
Figure 6D:
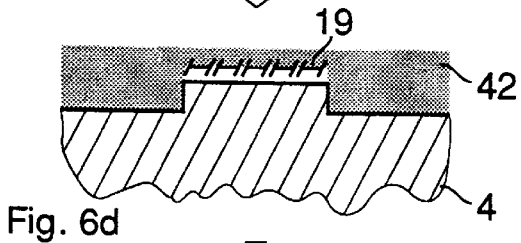
Figure 6E:
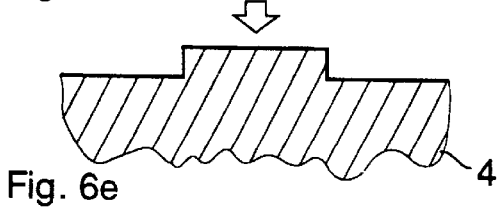

FIG. 6a and b show the monolayer 15 of molecules on top of the substrate 4 before and after patterning by using, for instance, one of the arrangements sketched in FIG. 5 which convert the molecules from the first conformation 18 into the second conformation 19. In a next step, shown in FIG. 6c, the molecules in the first conformation 18 are removed with a first molecule-removing means. Then, as shown in FIG. 6d, the substrate 4 together with the remaining molecules in the second conformation 19 is exposed to a modifying means 42 which selectively attacks the uncovered areas of the substrate 4. Having reached a wanted level of modification which here is a prescribed etch depth as shown in FIG. 6d, the modification process is stopped by removing the layered medium form the modifying means 42 and the residues of the monolayer 15 of molecules are removed with a second molecule-removing means, leaving behind a topographic pattern on the substrate surface, as shown in FIG. 6e.

FIG. 7a–e sketch an alternative lithographic process, applicable for a monolayer 15 which originally consists of the molecules in the first conformation 18 in which they are mobile and form an incomplete monolayer 15 on the substrate 4. The second attractive force 5 between the molecules in the first conformation 18 and the substrate 4 is sufficiently small to allow thermal motion of the molecules along the substrate 4 such that a part of its surface is temporarily uncovered by the molecules.

Figure 7A:
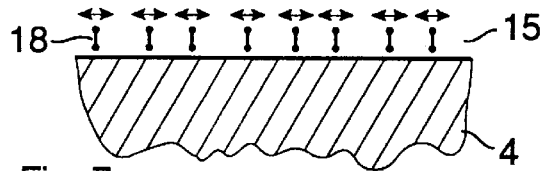
FIG. 7a–e: Subsequent steps in a process of structuring the surface of a substrate with a complete monolayer of switchable, attachable molecules.
Figure 7B:
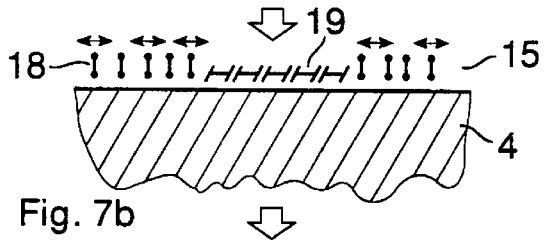

FIG. 7a, b show the monolayer 15 of molecules on top of the substrate 4 before and after patterning by using, for instance, one of the arrangements sketched in FIG. 5 which convert the molecules from the first conformation 18 into the second conformation 19. In this second conformation 19 the molecules are lying flat on the substrate 4, bound by the attractive forces (5, 6). They are covering the substrate 4 completely over a predetermined area in this second conformation 19.

Figure 7C:
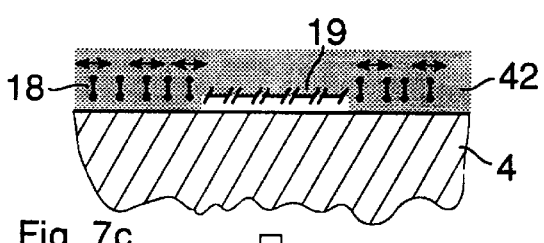
Figure 7D:
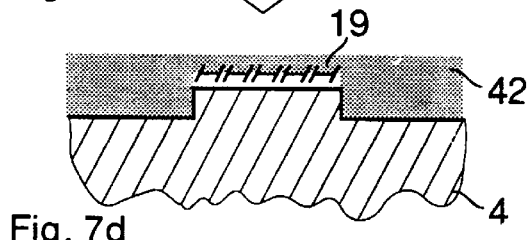
Figure 7E:
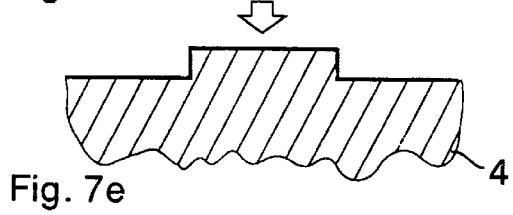

In a next step, shown in FIG. 7c, the substrate 4 with the molecular monolayer 15 in the two conformations 18, 19 is exposed to the modifying means 42 which selectively attacks the areas of the substrate 4 where the molecules in the first conformation 18 are floating on the substrate surface. Due to the thermally induced motion of the molecules the modifying means 42 reaches every place within the area where the molecules in the first conformation 18 are located. The molecules in the first conformation 18 may even happen to be removed from the substrate 4 by the modifying means 42 since they are bound loosely only to the substrate 4. The molecules in the second conformation however shield the substrate 4 from being modified. The modification needs not be a material-removing step, but can also be a step of adding material, such as growing a layer of any wanted material, using the molecules in the second conformation as a shielding mask.

The further steps of the process are the same as in the first process sketched in FIG. 6a–e, i. e. removing the modifying means 42 and hence stopping the etching process and also removing the molecules in the second conformation 19. The only difference between the two processes in fact is the step of removal of those parts of the monolayer 15 which remain in the first conformation 18, shown in FIG. 6b. This step is not necessary in the second process since, in this case, the molecules in the first conformation 18 are mobile on the surface of substrate 4 and hence do not permanently prevent the attack of the substrate 4 by the modifying means 42.

Figure 8A:
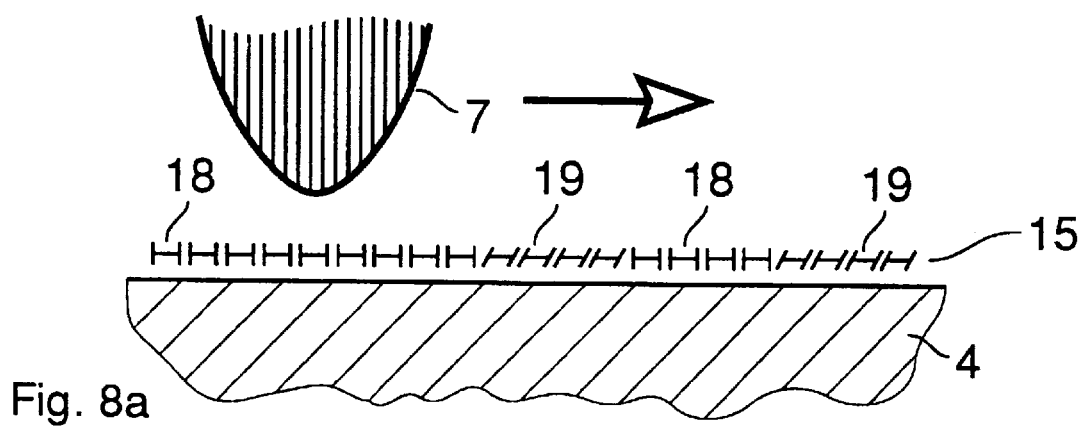
FIG. 8a: An arrangement for interrogating the conformation of the molecules of a layered medium by means of a movable stylus which here is an STM tip.

FIG. 8a illustrates the use of a layered medium with the attachable, switchable molecules in form of a monolayer with the two conformations 18, 19 on the substate 4 as a storage medium. Information is stored in the varying conformations 18, 19. Since the conformation 18, 19 may have an impact on size, electrical resistance, reflectivity, transmittivity, magnetic properties etc., the alternation of one or several of these properties of the areas of the layered medium can be used to retrieve the stored information. The pattern may have been generated, i. e. written by using one of the arrangements sketched in FIG. 5. A stylus 7 which here is the tip of a scanning tunneling microscope (STM) is moved along the monolayer 15 in close, preferrably constant distance for the purpose of interrogating, i. e. reading the information stored in the pattern.

Figure 8B:
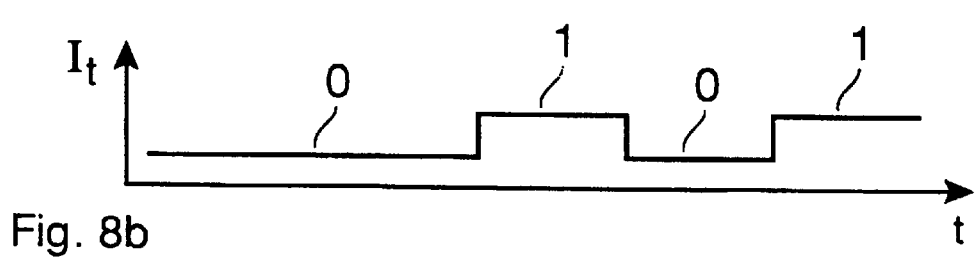
FIG. 8b: diagram of the variation of the tunnel current when the tip in the arrangement according to FIG. 8a moves along the surface of the layered medium.

FIG. 8b schematically shows a diagram of the tunnel current $I_t$ versus time t. The tunnel current varies between two different values since the tunneling probability of electrons depends sensitively on the conformation 18, 19 of the molecules under the tip apex. The bit values "1" and "0" can be readily assigned to the two different values of the tunnel current $I_t$.

Figure 9:
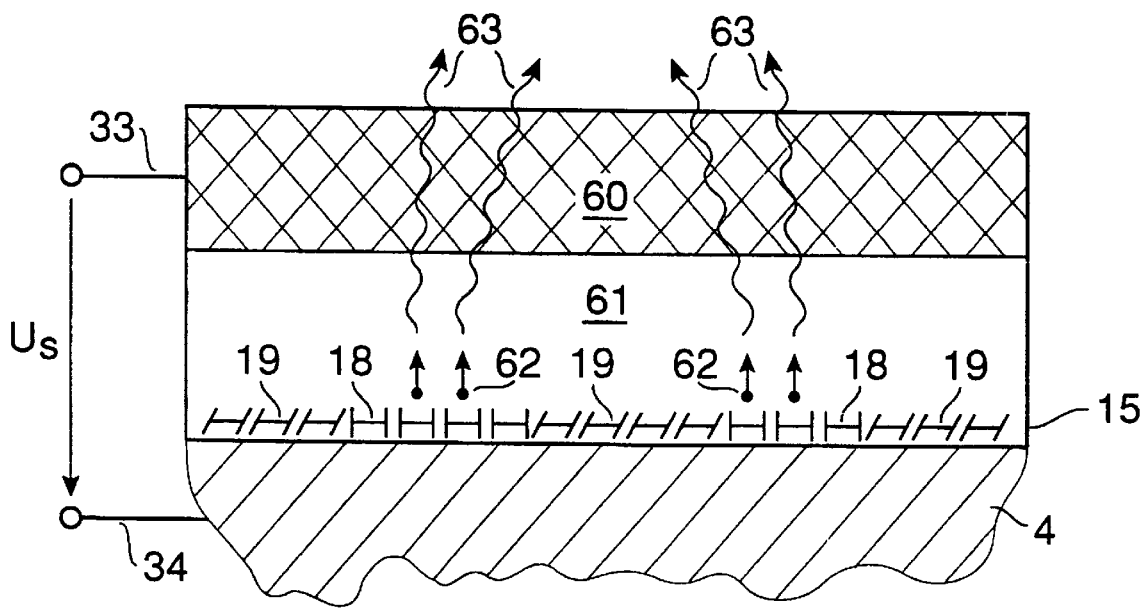
FIG. 9: An OLED with a layered medium with switchable, attachable molecules, existing in two different configurations, one of them acting as electron injection promoter.

FIG. 9 schematically sketches a cross section through an OLED which incorporates, in contrast to the OLEDs known so far, a layered medium which here comprises a monolayer 15 in two conformations 18 and 19. The other elements of the OLED are, from top to bottom, a transparent electrode 60, a continuous light-emitting polymer layer 61 and a conductive substrate 4. The substrate 4 and the transparent electrode 60 are connected to a voltage $U_s$ via voltage supply lines 33, 34.

The drawing also shows the electrons 62 injected from the substrate 4 and photons 63 emitted from the polymer layer 61. The substrate 4 acts as electron-injecting counterelectrode to the transparent electrode 60. The electrons injected into the polymer layer 61 loose their energy by the emission of the photons 63. The injection probability depends sensitively on the properties of the interface between the polymer layer 61 and the substrate 4, i. e. the electron transfer (ET) capability of the monolayer 15. The electron transfer (ET) capability is determined by the properties of the electronic states of the molecules. The latter are different in the different conformations 18, 19 of the molecules. Appropriate design of the molecules in the monolayer 15 therefore allows to switch such an OLED from a highly efficient light-emitting state into a dark state and vice versa by changing from the first conformation 18, into the second conformation 19 of the respective molecules. Switching between the conformations 18, 19 can be achieved in analogy to the methods with the arrangements described in FIG. 5, for instance by application of a short voltage pulse. Appropriate structuring of the electrodes 4, 60 allows to turn on and off the electron transfer (ET) capability and hence the light emission in predetermined areas of the OLED. Such capability can be useful in display applications-of OLEDs, providing functions similar to that of the thin-film transistor switches in active LCDs .

It can be summarized that the invention bases on a molecule being separateable into several entities 1, 3. The entities 1, 3 are more or less flexibly connected e.g. by binding electronic orbits 2. The entities 1, 3 can be arranged stably or meta-stably at different orientations with respect to each other, the different orientations corresponding to different conformations 18, 19 of the molecules. The stable orientations are given by the minima of the potential energy of the molecule with respect to the configurational coordinate or coordinates characteristic for the different conformations 18, 19. The molecules stably adhere to a desirable substrate 4 surface in at least one of the different conformations 18, 19. The switching may comprise a relative, rotational and/or translational movement of the entities 1, 3 with respect to each other and/or to the substrate 4.

In addition to the presented examples, the switching of molecular conformation in the context of data storage, lithography, molecular electron transport and light emission from optoelectronic devices it is important to point out that conformation in general determines any physical and chemical property of molecular systems. Thus, the presented methods for design, integration and adressing of the molecular conformation can be combined with most other physical and chemical detection mechanisms. The mentioned tools and methods can be combined with each other and with other techniques for detection, or assembly of functional nanoscale structures. In particular, said techniques can be combined with any sensing method as cantilever-based sensors, vibrating reed magnetometer, NMR, ESR, immunosensors, wave guide and diffraction optical sensors, single photon detection/single molecule spectroscopy set-ups. Also alternative properties can be controlled/switched using the disclosed schemes. In general, any chemical functionality, e. g. chromophority, photochromic activity, electrochromic activity, catalytic activity, enzymatic activity, drug activity, specific reactivity, spin labels, immuno activity, NMR labels, hormones, potentially combines with conformational switching/activation. Examples are the patterning or control of superconductivity in organic superconductors, the control of selective chemical reactivity, for example given by a radical that is hidden in one of the conformations and exposed to some reactant in the other conformation, or the variation of magnetic, and electronic properties of layers, e. g. layer magnetism, optical reflectivity, that go beyond the above mentioned examples. Mixtures of designed conformational systems can be utilized to expose specific properties. Using the above mentioned example of specific reactivity hidden in a conformational inactive form, different reaction precursors may be specifically integrated. Beyond the integration techniques specifically mentioned in the examples, particle beam and optical lithography as well as stamping, other techniques for excitation of conformational forms and the assembly and integration may well prove use, such as contact forces. As well chemical self-assembly techniques, LIGA, all advanced and exploratory means to lithographically integrate functional structures, as well as the advanced 'bottom up' integration techniques may be used.

Any write medium can also be used as read medium. Generally, any read mechanism can be used.

We claim:

1. Molecule comprising at least two entities (1, 3) which are bound to each other by at least one connection (2) and being attachable to a substrate (4) and being switchable under an external influence between at least two different stable or metastable conformations (18, 19) which are distinguishable by a different arrangement of said entities (1, 3) with respect to said substrate (4) and/or to each other, characterized in that, when said molecule is attached to said substrate (4), in a first of said conformations (18) said molecule is attracted to said substrate (4) by means of a second attractive force (5) between a second (3) of said entities (1, 3) and said substrate (4) and a first (1) of said entities (1, 3) has a position with respect to said substrate (4) at which a first attractive force (6) between them is negligible versus said second attractive force (5) and that in a second of said conformations (19) said first entity (1) has a position at which it is bound to said substrate (4) by said first attractive force (6).

2. Molecule, according to claim 1, characterized in that the position of the molecule on the substrate (4) is fixed in at least one of the conformations (18, 19).

3. Molecule, according to claim 1 or 2, characterized in that the molecule is switchable reversibly between the first and the second conformation (18, 19).

4. Molecule, according to one of claims 1–3, characterized in that the first entity (1) has a central position within the molecule and that the second entity (3) comprises at least one peripheral entity which is movably connected to said first entity (1).

5. Layered medium, comprising a plurality of molecules according to one of claims 1 to 4, arranged in the shape of a complete or incomplete monolayer (15) on a substrate (4).

6. Layered medium according to claim 5, characterized in that the molecules remain at fixed positions on the substrate (4) in all conformations (18, 19) as well as during switching.

7. Layered medium according to claim 5, characterized in that the molecules in at least one of the conformations (18, 19) are movable along the substrate (4) and that said molecules are in continuous motion along the substrate (4) due to thermal excitation such that an area of said substrate (4) is temporarily uncovered, and that in at least one other of said conformations (18, 19), said molecules remain in a fixed position on said substrate.

8. Layered medium according to one of claims 5 to 7, characterized in that the substrate (4) is electrically conductive, and that in one of the conformations (18, 19), the molecules favor a capability of said substrate (4) to emit electrons into an adjacent non-metallic medium and that in another of said conformations (18, 19) said electron emission capability is smaller.

9. Layered medium, according to claim 8, characterized in that it is at least a part of an electron injection electrode of an organic light-emitting diode whose light emission capability is switchable between various efficiencies by switching between the conformations (18, 19) of the molecules of said layered medium.

10. Method for creating a predetermined pattern in a layered medium according to one of claims 5 to 9, characterized in that in a first step a region of said layered medium is selected and in a second step said selected region is exposed to a structuring means which switches said molecules in said selected region from one of the conformations (18, 19) into another of said conformations (18, 19).

11. Method for creating a predetermined pattern according to claim 10, characterized in that in a third step the molecules in one of the conformations (18, 19) are removed with a first molecule-removing means.

12. Method for creating a predetermined pattern according to claim 10 or 11 characterized in that in a following step, the substrate (4) is patterned using the molecules, which after the previous step have remained in a fixed position on said substrate (4), as a patterning mask.

13. Method for creating a predetermined pattern according to one of claims 10 to 12, characterized in that in a last step the molecules are removed from the substrate (4) by a second molecule-removing means.

14. Method for creating a predetermined pattern according to one of claims 10 to 13, characterized in that as the structuring means at least a stylus (7) is used, which performs the switching function and is movable along the layered medium on a path that corresponds to the shape of the pattern to be created.

15. Method for creating a predetermined pattern according to one of claims 10 to 13 characterized in that as the structuring means at least a stamp (20) is used, which performs the switching function and which comprises protrusions (21), structured according to the pattern to be created.

16. Method for creating a predetermined pattern according to one of claims 10 to 13, characterized in that as the structuring means at least an actuator array (30) is used, which performs the switching function and is, for creating the pattern, arranged in proximity of or in contact with the layered medium and whose actuators (31) are individually activatable.

17. Method for creating a predetermined pattern according to one of claims 10 to 13, characterized in that as the structuring means at least an illumination apparatus or particle beam apparatus is used.

18. Method for interrogating a pattern in a layered medium according to one of claims 5 to 9, or on a substrate, characterized in that the structuring means according to one of claims 14 to 17 is used as interrogating means.

* * * * *